United States Patent [19]

Deschu

[11] 4,090,582

[45] May 23, 1978

[54] SPEAKER PROTECTOR

[76] Inventor: Dennis F. Deschu, 176 Highland Ave., Yardville, N.J. 08620

[21] Appl. No.: 738,025

[22] Filed: Nov. 2, 1976

[51] Int. Cl.[2] .......... H05K 5/00

[52] U.S. Cl. .......... 181/150; 181/153; 181/199

[58] Field of Search .......... 181/141, 144, 145, 148, 181/149, 150, 151, 152, 153, 154, 155, 156, 197, 198, 199

[56] References Cited

U.S. PATENT DOCUMENTS

| | | | |
|---|---|---|---|
| 1,844,802 | 2/1932 | Seabert | 181/151 |
| 3,746,125 | 7/1973 | Hammes | 181/199 |
| 3,993,345 | 11/1976 | Croup | 181/150 |

*Primary Examiner*—L. T. Hix
*Assistant Examiner*—Benjamin R. Fuller
*Attorney, Agent, or Firm*—Leonard W. Suroff

[57] ABSTRACT

A speaker protector to enclose the rear of a speaker mounted on a panel in a motor vehicle or the like and comprising housing means including a bottom wall, a tapered side wall extending upwardly and outwardly from the bottom wall, and an outwardly extending circumferential rim connected to the side wall, with the rim having an upper surface and an inner surface terminating in an outer margin. The side wall defines a cavity adapted to receive therein the rear of the speaker to enclose same, with mounting means operatively associated with the rim for securing the housing means to the panel. Adjusting means is operatively associated with the side wall for permitting angular selective positionment of the bottom wall relative to the rim so as to facilitate mounting of the housing means in a variety of locations, and locking means is operatively associated with the housing means so as to cause the bottom wall to be retained in the angular fixed selective position obtained in using the adjusting means.

25 Claims, 9 Drawing Figures

SPEAKER PROTECTOR

BACKGROUND OF THE INVENTION

1. Field of the Invention

The present invention relates to a protector or cover for the rear of a speaker that is mounted in a motor vehicle or the like.

The speaker protector of the present invention is to protect indoor speakers from getting wet due to rain or car washing. The speaker protector is designed to completely surround and enclose the back of the speaker. The speaker protector not only keeps car speakers dry and corrosion free, it also improves the sound that they produce. Instead of letting all "back sound", the sound that is pushed out the back of the speaker, escape into the automobile door, the speaker protector closes off the back of the speaker and helps the speaker push more sound out the front into the car's interior. The result is more base response and a richer sound.

2. Description of the Prior Art

The provision of a rear enclosure for a speaker is illustrated in the prior art in U.S. Pat. No. 2,186,276. The hollow housing provided is ideally suited for fixed dimensions when the speaker enclosure is provided with the car.

I have found that to install a speaker protector after the car is manufactured it is necessary that it be adjustable to fit various locations within the motor vehicle and not merely of a fixed dimension. The advantages and distinctions of my invention over the prior art will become more clearly evident as the disclosure proceeds.

OBJECTS OF THE INVENTION

An object of the present invention is to provide a speaker protector that may be easily mounted in a motor vehicle to enclose the rear of the loud speakers that might be contained therein.

Another object of the present invention is to provide a speaker protector that is adjustable in dimension in order to fit within different size spaces behind the loud speaker.

Another object of the present invention is to provide a speaker protector having mounting means thereon, and which has adjusting means on the side wall thereof to permit the bottom wall of the protector to be angled as desired when mounting in a motor vehicle.

Another object of the present invention is to provide a speaker protector that has a configuration to permit the nesting of one protector within another protector during shipment thereof, and stacking means to permit removal of one protector from the other.

Other objects and advantages of the present invention will become apparent as the disclosure proceeds.

SUMMARY OF THE INVENTION

A speaker protector to enclose the rear of a speaker mounted on a panel in a motor vehicle or the like and comprising housing means including a bottom wall, a tapered side wall extending upwardly and outwardly from the bottom wall, and an outwardly extending circumferential rim connected to the side wall, with the rim having an upper surface and an inner surface terminating in an outer margin. The side wall defines a cavity adapted to receive therein the rear of the speaker to enclose same, with mounting means operatively associated with the rim for securing the housing means to the panel.

Adjusting means is operatively associated with the side wall for permitting angular selective positionment of the bottom wall relative to the rim so as to facilitate mounting of the housing means in a variety of locations, and locking means is operatively associated with the housing means so as to cause the bottom wall to be retained in the angular fixed selective position obtained in using the adjusting means.

The side wall may be frustoconical in shape, with the outer margin having an annular configuration, and the mounting means including a plurality of openings extending in the rim between the surfaces. The openings are elongated to facilitate mounting of the protector, and may extend outwardly in a radial direction from the side wall, or in a fixed radial distance to said side wall.

The adjusting means includes at least one set of a plurality of spaced apart horizontally extending integrally formed ribs on the side wall and the ribs being flexible to permit the angular selective positionment of said bottom wall relative to the rim. The ribs are accordian like in structure and integrally formed with the side wall.

The locking means may include a strap having one end fixed to the housing means and a free end with the strap extending across the rear wall. The strap has a plurality of longitudinally spaced apart holes adjacent the free end thereof, with a catch on the housing means adapted to extend in frictional engagement through one of the openings, so as to retain the bottom wall in the angular fixed selective position obtained in using the adjusting means.

In accordance with one embodiment the rim includes an outer section and an inner section with the mounting means including openings in each of the sections, such that at least two mounting diameters can be accomodated by the rim, and coupling means for releasably securing the outer section to the inner section is also provided.

The housing means are adapted to be nested within each other prior to use thereof, and stacking means is operatively associated with the housing means to permit the stacking. The stacking means may include a plurality of spaced apart stacking lugs extending upwardly from the bottom wall such that the rims will not jam when a plurality of speaker protectors are nested.

There is provided between the inner section and the outer section interlocking surfaces for abutting engagement with each other between the upper surface and the inner surface of the rim. The outer section having transversely extending tabs for locking engagement with each other, such that upon release of the tabs the outer section may be removed from the inner section.

BRIEF DESCRIPTION OF THE DRAWINGS

Although the characteristic features of the invention will be particularly pointed out in the claims, the invention itself, and the manner in which it may be made and used, may be better understood by referring to the following description taken in connection with the accompanying drawings forming a part hereof, wherein like reference numerals refer to like parts throughout the several views and in which:

DETAILED DESCRIPTION OF THE DRAWINGS

Figure 3:
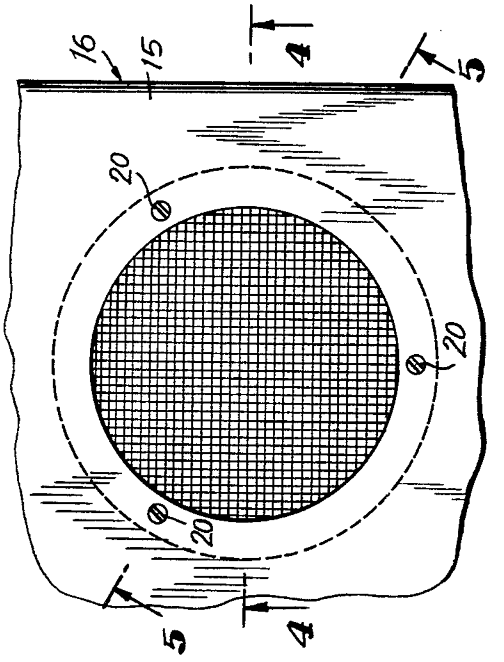
FIG. 3 is a front view of the loud speaker with the speaker protector of the present invention mounted behind it.

Referring to the drawings there is illustrated in FIGS. 1 through 8 embodiments of a speaker protector 10 to enclose the rear 12 of a speaker mounted on a panel 15 in a motor vehicle 16 or the like. The speaker 14 may include a flange 18 that is normally secured to the panel 15 as by bolts or fasteners 20 extending in a circular mounting arrangement.

The speaker protector 10 includes housing means 22 having a bottom wall 24 with an inner surface 25 and outer surface 26. A tapered side wall 28 extends upwardly and outwardly from the bottom wall 24, and having an inner surface 30 and outer surface 32. An outwardly extending circumferential rim 35 is connected to the side wall 28 with the rim 35 having an upper surface 36 and an inner or lower surface 38. The surfaces 36 and 38 terminating in an outer margin 40. The side wall 28 defines a cavity 42 adapted to receive therein the rear 12 of the speaker 14 to enclose same, with mounting means 45 operatively associated with the rim 35 for securing the housing means 22 to the panel 15.

Figure 1:
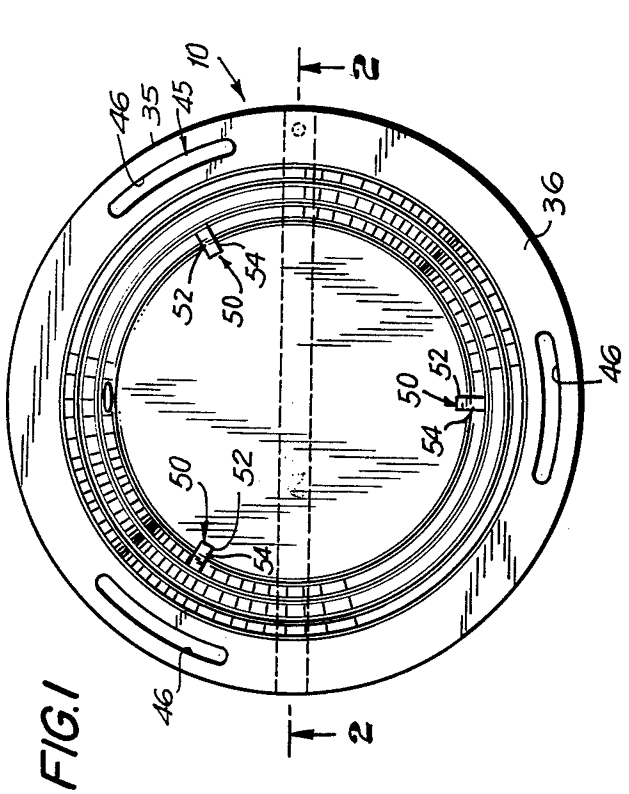
FIG. 1 is a front plan view of the speaker protector in accordance with the present invention.

The side wall 28 may be frustoconical in shape, with the outer margin 40 of the rim 35 having an annular configuration, and the mounting means 45 including a plurality of openings 46 extending in the rim 35 between the surfaces 36 and 38. The openings 46 are elongated to facilitate mounting of the protector 10, and may extend outwardly in a fixed radial distance to said side wall 28 as illustrated in FIG. 1. The openings 46 are spaced to fit the mounting fasteners 20. In this way the fasteners 20 provide the dual function of mounting the speaker protector 10 and the speaker 14.

Figure 2:
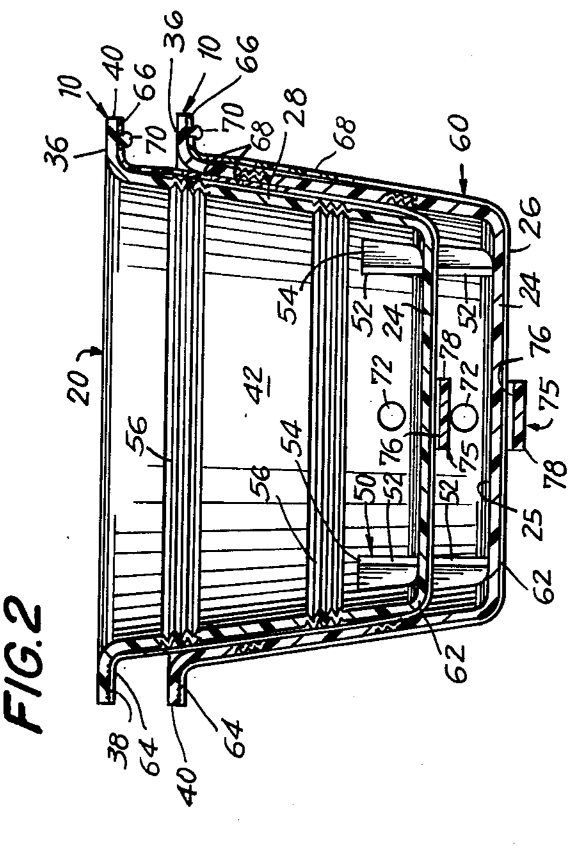
FIG. 2 is a sectional view taken along lines 2—2 of FIG. 1, illustrating the protectors in nesting relationship to each other.

The bottom wall 24, side wall 28 and rim 35 may be integrally formed with each other out of plastic or even metal. The housing means 22 are adapted to be nested within each other as illustrated in FIG. 2, prior to use thereof. Stacking means 50 is operatively associated with the housing means 22 to permit the stacking of the protectors 10. The stacking means 50 may include a plurality of spaced apart vertically extending stacking lugs 52 extending upwardly from the bottom wall 24 such that the rims 35 will not jam when a plurality of speaker protectors 10 are nested. Each lug 52 may have an upper surface or edge 54 to engage the outer surface 26 of the bottom wall 24. The lugs 52 may be integrally formed with the housing means 22.

Figure 4:
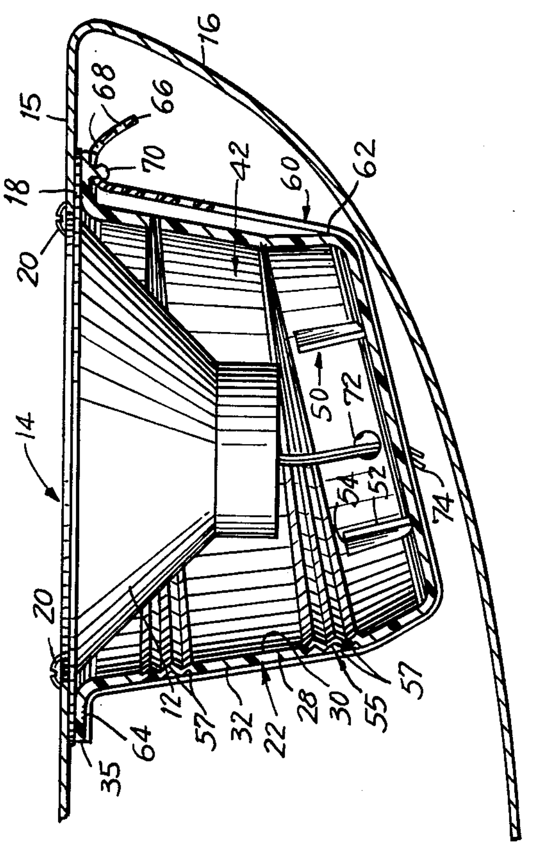
FIG. 4 is a sectional view taken along lines 4—4 of FIG. 3.
Figure 5:
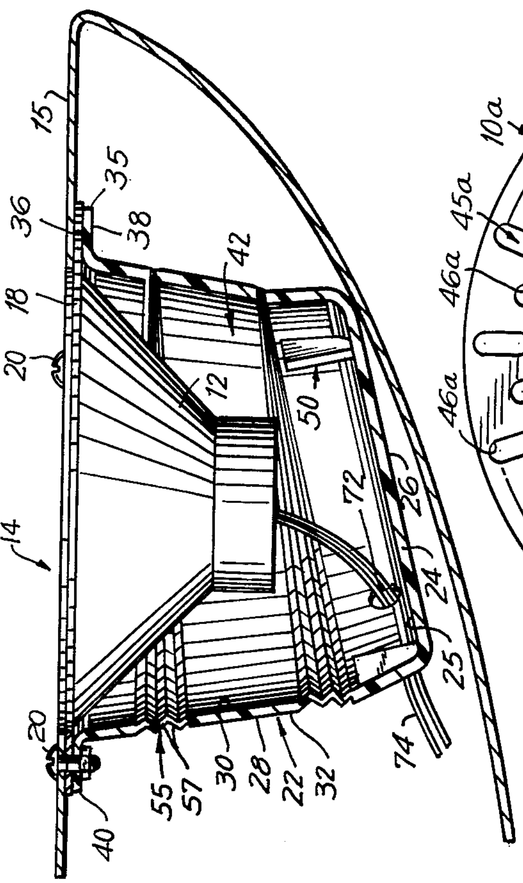
FIG. 5 is a sectional view taken along lines 5—5 of FIG. 3.

Adjusting means 55 is operatively associated with the side wall 28 for permitting angular selective positionment of the bottom wall 24 relative to the rim 35 so as to facilitate mounting of the housing means 22 in a variety of locations. As illustrated in FIGS. 4 and 5 the axial length of the speaker protector 10 can be varied by use of the adjusting means 55.

The adjusting means 55 includes at least one set 56 of a plurality of spaced apart horizontally extending integrally formed ribs 57 on the side wall 28. The ribs 57 being flexible to permit the angular selective positionment of the bottom wall 24 relative to the rim 35. The ribs are accordian like in structure and integrally formed with the side wall 28. Two sets 56 of ribs 57 are illustrated in FIG. 2 in vertical spaced relationship to each other. The ribs 57 extend between the surfaces 30 and 32, and bend in conforming relationship to the force applied against the bottom wall 24. The bottom wall 24 may be bent to conform the side wall 28 to the available space as illustrated in FIGS. 4 and 5.

Locking means 60 is operatively associated with the housing means 22 so as to cause the bottom wall 24 to be retained in the angular fixed selective position obtained by using the adjusting means 55. The locking means 60 may include a strap 62 having one end 64 fixed to the housing means 22 and a free end 66. The strap extending across the rear or bottom wall 24 with a plurality of longitudinally spaced apart holes 68 adjacent the free end 66 thereof. A catch 70 on the housing means 22 is adapted to extend in frictional engagement through one of the openings or holes 68 so as to retain the bottom wall 24 in the angular fixed selective position obtained in using the adjusting means 55.

The end 64 of the strap 62 may be welded to the lower surface 38 of the rim 35. In a similar manner the catch 70 may extend downwardly from the lower surface 38. An aperture 72 is provided on the side wall 28 to permit the wires 74 of the speaker 14 to pass therethrough. Vent holes may also be provided.

To maintain the strap 62 in fixed position retaining means 75 is provided on the housing means 22. The retaining means 75 may be positioned on the bottom wall 24 and include a groove 76 in a clip 78 for receiving the strap 62 therethrough.

Figure 6:
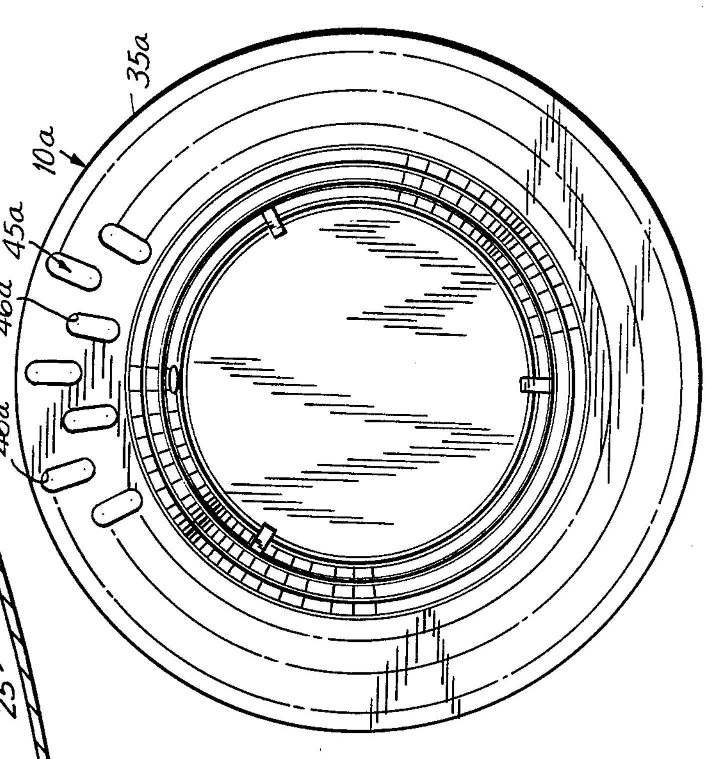
FIG. 6 is a front plan view of an alternate embodiment of the present invention.

FIG. 6 illustrates another embodiment of a speaker protector **10*a* in which the mounting means 45*a* includes a plurality of openings 46*a* that extend outwardly in a radial direction. The openings 46*a* extend through the rim 35*a*** and may be dimensioned to accomodate mounting fasteners or different diameters.

Figure 7:
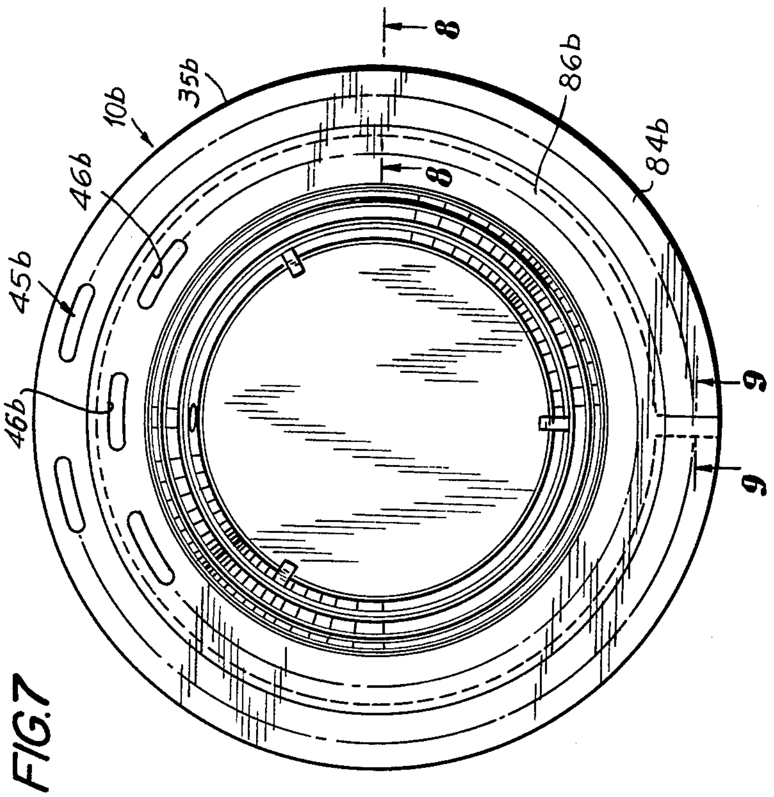
FIG. 7 is a front plan view of another alternate embodiment of the present invention.
Figure 8:
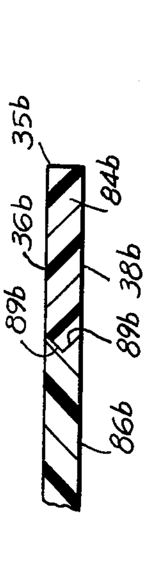
FIG. 8 is a fragmentary sectional view taken along lines 8—8 of FIG. 7.
Figure 9:
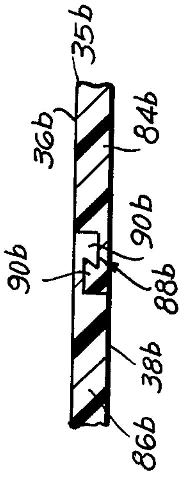
FIG. 9 is a fragmentary sectional view taken along lines 9—9 of FIG. 7.

In accordance with another embodiment of the invention illustrated in FIGS. 7 through 9 the speaker protector **10*b* is provided with a rim 35*b* that includes an outer section 84*b* and an inner section 86*b* with the mounting means 45*b* including openings 46*b* in each of the sections 84*b* and 86*b*, such that at least two mounting diameters can be accomodated by the rim 35*b*. Coupling means 88*b* for releasably securing the outer section 84*b*** to the inner section is also provided.

There is provided between the inner section **86*b* and the outer section 84*b* interlocking surfaces 89*b* for abutting engagement with each other between the upper surface 36*b* and the inner surface 38*b* of the rim 35*b*. The outer section 84*b* having transversely extending tabs 90*b* forming part of the coupling means 88*b* for locking engagement with each other, such that upon release of the tabs 90*b* the outer section 84*b* may be removed from the inner section 86*b*. The transversely extending tabs 90*b* may extend between the upper surface 36*b* and the inner surface 38*b*. The outer section 84*b* being removable when the mounting holes 46*b* of the inner section 86*b*** are utilized for mounting of the speaker protector 10*b*. When the speaker protector 10*b* is to be used for use with existing motor vehicles this provides maximum amounts of adjustment.

Although illustrative embodiments of the invention have been described in detail herein with reference to the accompanying drawings, it is to be understood that the invention is not limited to the precise embodiments, and that various changes and modifications may be effected therein without departing from the scope or spirit of the invention.

I claim:

1. A speaker protector to enclose the rear of a speaker mountd on a panel in a motor vehicle or the like, said speaker protector comprising A. housing means including
   (1) a bottom wall,
   (2) a tapered side wall extending upwardly and outwardly from said bottom wall, and
   (3) an outwardly extending circumferential rim connected to said side wall, said rim having an upper surface and an inner surface terminating in an outer margin, said side wall defining a cavity adapted to receive therein the rear of the speaker to enclose same, B. A mounting means operatively associated with said rim for securing said housing means to the panel, C. adjusting means operatively associated with said side wall for permitting angular selective positionment of said bottom wall relative to said rim so as to facilitate mounting of said housing means in a variety of locations, and D. locking means operatively associated with said housing means so as to cause said bottom wall to be retained in the angular fixed selective position obtained in using said adjusting means.

2. A speaker protector as in claim 1, wherein said side wall being of a fructoconical shape, said outer margin having an annular configuration, and said mounting means including a plurality of openings extending in said rim between said surfaces.

3. A speaker protector as in claim 2, wherein said openings are elongated to facilitate mounting of the protector.

4. A speaker protector as in claim 3, wherein said openings extend outwardly in a radial direction from said side wall.

5. A speaker protector as in claim 3, wherein said openings extend in a fixed radial distance to said side wall.

6. A speaker protector as in claim 1, a. wherein said rim includes an outer section and an inner section, b. said mounting means including openings in each of said sections, such that at least two mounting diameters can be accomodated by said rim, and c. coupling means for releasably securing said outer section to said inner section.

7. A speaker protector as in claim 6, wherein a. said inner section and said outer section having interlocking surfaces for abutting engagement with each other between said upper surface and said inner surface, and b. said outer section having transversely extending tabs for locking engagement with each other, such that upon release of said tabs said outer section may be removed from said inner section.

8. A speaker protector as in claim 7, wherein said transversely extending tabs extend between said upper surface and said inner surface.

9. A speaker protector as in claim 1, a. wherein said housing means are adapted to be nested within each other prior to use thereof, and b. stacking means operatively associated with said housing means to permit stacking thereof.

10. A speaker protector as in claim 9, wherein said stacking means comprises a plurality of spaced apart stacking lugs extending upwardly from said bottom wall such that the rims will not jam when a plurality of speaker protectors are nested.

11. A speaker protector as in claim 1, wherein said housing means includes an aperture in said side wall for the wires of the speaker to pass therethrough.

12. A speaker protector as in claim 1, wherein said adjusting means includes at least one set of a plurality of spaced apart horizontally extending integrally formed ribs on said side wall, and said ribs being flexible to permit said angular selective positionment of said bottom wall relative to said rim.

13. A speaker protector as in claim 12, wherein said ribs are accordian like in structure and integrally formed with said side wall.

14. A speaker protector as in claim 1, wherein said locking means includes a. a strap having one end fixed to said housing means and a free end, said strap extending across said bottom wall, b. a plurality of longitudinally spaced apart holes in said strap adjacent said free end, and c. a catch on said housing means adapted to extend in frictional engagement through one of said holes, so as to retain said bottom wall in said angular fixed selective position obtained in using said adjusting means.

15. A speaker protector to enclose the rear of a speaker mounted on a panel in a motor vehicle or the like, said speaker protector comprising A. housing means including
   (1) a bottom wall,
   (2) a tapered side wall extending upwardly and outwardly fromsaid bottom wall, and
   (3) an outwardly extending circumferential rim connected to said side wall, said rim having an upper surface and an inner surface terminating in an outer margin, said side wall defining a cavity adapted to receive therein the rear of the speaker to enclose same, B. mounting means operatively associated with said rim for securing said housing means to the panel, C. adjusting means operatively associated with said side wall for permitting angular selective positionment of said bottom wall relative to said rim so as to facilitate mounting of said housing means in a variety of locations, said adjusting means including at least one set of a plurality of spaced apart horizontally extending integrally formed ribs on said side wall, said ribs being flexible to permit said angular selective positionment of said bottom wall relative to said rim, and D. locking means operatively associated with said housing means so as to cause said bottom wall to be retained in the angular fixed selective position obtained in using said adjusting means, said locking means including (1) a strap having one end fixed to said housing means and a free end, said strap extending across said bottom wall, (2) a plurality of longitudinally spaced apart holes in said strap adjacent said free end, and (3) a catch on said housing means adapted to extend in frictional engagement through one of said holes, so as to retain said bottom wall in said angular fixed selective position obtained in using said adjusting means.

16. A speaker protector as in claim 15, wherein said catch extends outwardly from said inner surface of said rim, and said strap is secured to said inner surface of said rim in substantially aligned relationship to said catch.

17. A speaker protector as in claim 15, and including retaining means on said housing means for maintaining said strap in position across said bottom wall.

18. A speaker protector as in claim 17, wherein said retaining means includes a groove on said bottom wall for receiving said strap therethrough.

19. A speaker protector as in claim 15, a. wherein said side wall being of a frustoconical shape, with said outer margin having an annular configuration, and b. said mounting means including a plurality of openings extending in said rim between said surfaces.

20. A speaker protector as in claim 15, a. wherein said rim includes an outer section and an inner section, b. said mounting means including openings in each of said sections, such that at least two mounting diameters can be accomodated by said rim, and c. coupling means for releasably securing said outer section to said inner section.

21. A speaker protector as in claim 20, wherein a. said inner section and said outer section having interlocking surfaces for abutting engagement with each other between said upper surface and said inner surface, b. said outer section having transversely extending tabs for locking engagement with each other, such that upon release of said tabs said outer section may be removed from said inner section, and c. said transversely extending tabs extend between said upper surface and said inner surface.

22. A speaker protector as in claim 15, a. wherein said housing means are adapted to be nested within each other prior to use thereof, b. stacking means operatively associated with said housing means to permit stacking thereof, and c. said stacking means comprises a plurality of spaced apart stacking lugs extending upwardly from said bottom wall such that the rims will not jam when a plurality of speaker protectors are nested.

23. A speaker protector as in claim 15, wherein two sets of said ribs are provided on said side wall in spaced relationship to each other.

24. A speaker protector as in claim 15, wherein said housing means includes an aperture in said side wall for the wires of the speaker to pass therethrough.

25. A speaker protector as in claim 15, wherein said ribs are accordian like in structure and integrally formed with said side wall.

* * * * *